(12) United States Patent
Cantaloube et al.

(10) Patent No.: US 11,862,593 B2
(45) Date of Patent: Jan. 2, 2024

(54) ELECTROPLATED INDIUM BUMP STACKS FOR CRYOGENIC ELECTRONICS

(71) Applicant: Microsoft Technology Licensing, LLC, Redmond, WA (US)

(72) Inventors: Christopher Cantaloube, Boca Raton, FL (US); Richard P. Rouse, Kirkland, CA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 130 days.

(21) Appl. No.: 17/315,115

(22) Filed: May 7, 2021

(65) Prior Publication Data

US 2022/0359444 A1 Nov. 10, 2022

(51) Int. Cl.
*H01L 23/00* (2006.01)

(52) U.S. Cl.
CPC .............. *H01L 24/13* (2013.01); *H01L 24/04* (2013.01); *H01L 24/05* (2013.01); *H01L 24/11* (2013.01); *H01L 24/03* (2013.01); *H01L 2224/0345* (2013.01); *H01L 2224/0401* (2013.01); *H01L 2224/05073* (2013.01); *H01L 2224/05573* (2013.01); *H01L 2224/05666* (2013.01); *H01L 2224/05684* (2013.01); *H01L 2224/11005* (2013.01); *H01L 2224/11462* (2013.01); *H01L 2224/11912* (2013.01); *H01L 2224/13082* (2013.01); *H01L 2224/13109* (2013.01); *H01L 2224/13147* (2013.01)

(58) Field of Classification Search
CPC ......... H01L 24/13; H01L 24/04; H01L 24/05; H01L 24/11; H01L 24/03; H01L 2224/0345; H01L 2224/0401; H01L 2224/05073; H01L 2224/05573; H01L 2224/11005; H01L 2224/11462; H01L 2224/11912; H01L 2224/13082; H01L 2224/13109; H01L 2224/13147

See application file for complete search history.

(56) References Cited

U.S. PATENT DOCUMENTS

2008/0277784 A1* 11/2008 Ozaki ............... H01L 23/49816
257/737
2009/0166888 A1 7/2009 Pozder et al.
(Continued)

FOREIGN PATENT DOCUMENTS

CN 105826421 A * 8/2016

*Primary Examiner* — Douglas W Owens
(74) *Attorney, Agent, or Firm* — Fountainhead Law Group PC (57) ABSTRACT

A cryogenic under bump metallization (UBM) stack includes an adhesion and barrier layer and a conductive pillar on the adhesion and barrier layer. The conductive pillar functions as a solder wetting layer of the UBM stack and has a thickness. An indium superconducting solder bump is on the conductive pillar. The thickness of the conductive pillar is sufficient to prevent intermetallic regions, which form in the conductive pillar at room temperature due to interdiffusion, from extending through the entire thickness of the conductive pillar to maintain the structural integrity of the UBM stack. The indium (In) solder bump may be formed through electroplating, with the conductive pillar being copper (Cu) and the adhesion and barrier layer being titanium tungsten (TiW) and a thin seed layer of copper (Cu), or a layer of titanium (Ti).

11 Claims, 5 Drawing Sheets

(56) References Cited

U.S. PATENT DOCUMENTS

| | | | |
|---|---|---|---|
| 2016/0343655 A1* | 11/2016 | Majeed | H01L 24/11 |
| 2017/0250153 A1* | 8/2017 | Kikuchi | H01L 24/81 |
| 2019/0088608 A1* | 3/2019 | Dadvand | C25D 5/12 |
| 2021/0125950 A1* | 4/2021 | Hisada | H01L 24/13 |
| 2022/0189898 A1* | 6/2022 | Jain | H01L 24/05 |

* cited by examiner

ELECTROPLATED INDIUM BUMP STACKS FOR CRYOGENIC ELECTRONICS

BACKGROUND

The present disclosure relates generally to interconnect structures for electronic components, and more specifically to under bump metallization structures for use in electronic systems operating at deep cryogenic temperatures.

A typical electronic system is designed to operate at room temperatures and includes electronic components integrated through circuit boards fabricated as a multilayer stack structure from dielectric layers and conductive layers. Electronic chips are mounted on either side of this multilayer stack structure and electrically interconnected through the conductive layers and conductive vias interconnecting these conductive layers. Cryogenic electronic systems operating at deep cryogenic temperatures (e.g., less than 10 Kelvin (10 K)) also require multilayer interconnect structures to electrically interconnect active and passive components forming the system. Deep cryogenic temperatures, however, present unique challenges to the configuration and fabrication of interconnect structures for electronic chips and circuit boards. For example, the heat generated by interconnect structures and components attached to these structures must be minimized. This is due to the sensitivity of active and passive components, such as superconducting and quantum devices, to temperature and the limitations and costs of providing cooling capacity to the system at deep cryogenic temperatures. The materials utilized in forming interconnect structures for cryogenic systems are accordingly of critical importance, with superconducting materials typically being utilized where possible to reduce the joule heating generated in the interconnect structures.

Flip chip interconnection is commonly used for interconnecting electronic chips and circuit boards in cryogenic systems. These flip chip interconnection structures include under bump metallization (UBM) structures or stacks including several metallic layers that provide an interface between a metal contact or bond pad on a chip and a metallic solder bump to be attached to a circuit board or other structure to which the chip is to be attached. The UBM stack typically includes three layers, each layer performing a different function. More specifically, the UBM stack includes an adhesion layer that functions to provide adhesion to the metal bond pad on the chip and a diffusion barrier layer on the adhesion layer that functions as a diffusion barrier between the material of this metal bond pad and a material of a solder wetting layer on the barrier layer and the material of the solder bump on the solder wetting layer.

Conventional room temperature flip chip interconnection structures include a UBM stack with a tin (Sn) solderable bump (i.e., "solder bump") on the UBM stack. Tin, however, is not ductile at deep cryogenic temperatures and tin-based solders are also susceptible to tin pest or tin disease, which can result in catastrophic failure of flip chip interconnects at cryogenic temperatures. As a result, flip chip interconnection structures for use at deep cryogenic temperatures frequently utilize indium (In) as the material of the solderable bump in the flip chip interconnection structure. Indium, unlike the tin-based solders, is a cryogenically ductile material. Indium also superconducts below 3.4K, can be compression bonded at room temperature, and has a lower melting point than tin-based solders.

To form fine pitch flip chip bumps (i.e., bumps having a diameter <100 μm) of indium as part of forming the flip chip interconnection structure requires either electroplating of indium into a photoresist template, or physical vapor deposition (PVD), either thermal or e-beam evaporation, followed by a lift off process. While the deposition of indium through PVD may be done at ultrafine pitches (<10 μm) and is flexible in terms of the materials utilized in the UBM stack, there are several drawbacks with the deposition of indium through PVD. First, the deposition of indium through PVD, such as through evaporation, is relatively slow, with a formation rate of 1-2 μm/hr. being typical. Additional time is also required for reaching required vacuum conditions that are part of the PVD process. In addition, the deposition of indium through PVD also results in much of the indium being wasted during deposition, increasing the raw material costs of the indium. Liftoff processes, which are required after the PVD, also have aspect ratio limitations. Due to these limitations of the deposition of indium through PVD, electroplating is the method of choice for the deposition of indium solder bumps on UBM stacks.

The formation of indium solder bumps through electroplating has been demonstrated using indium sulfamate plating baths at fine pitches (<20 μm pitch). Electroplating for deposition of indium solder bumps on UBM stacks is cheaper, faster and more scalable relative to formation of indium bumps through PVD. Electroplating of indium solder bumps is known in conjunction with conventional room temperature UBM stacks including a layer of nickel (Ni) as the solder wetting layer in the stack. Nickel is readily plateable through electroplating and advantageously has a slower rate of diffusion and intermetallic formation at room temperature with indium relative to other metals, such as copper (Cu). Nickel, however, is a magnetic material and is accordingly incompatible with sensitive superconducting logic devices utilized in cryogenic systems. In addition, the need to have a continuous plating base for providing current to the areas on the UBM stack on which the indium solder bumps are to be formed requires the ability to etch this plating base in the presence of indium. In view of the limitations of forming UBM stacks with indium solder bumps as part of the formation of flip chip interconnect structures for cryogenic systems, there is a need for improved structures and processes for forming UBM stacks with superconducting, such as indium, solder bumps.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Further, spatially relative terms, such as "beneath," "below," "lower," "above," "upper", "on," "over" and the like, may be used herein for ease of description to describe one element or feature in relation to another element or feature as illustrated in the figures. The spatially relative terms are intended to encompass different orientations of the described structures in use or operation in addition to the orientation depicted in the figures. The structures may be otherwise oriented, such as through a 90-degree rotation or at other orientations, and the spatially relative descriptors used herein may likewise be interpreted accordingly depending on the particular orientation.

Figure 1:
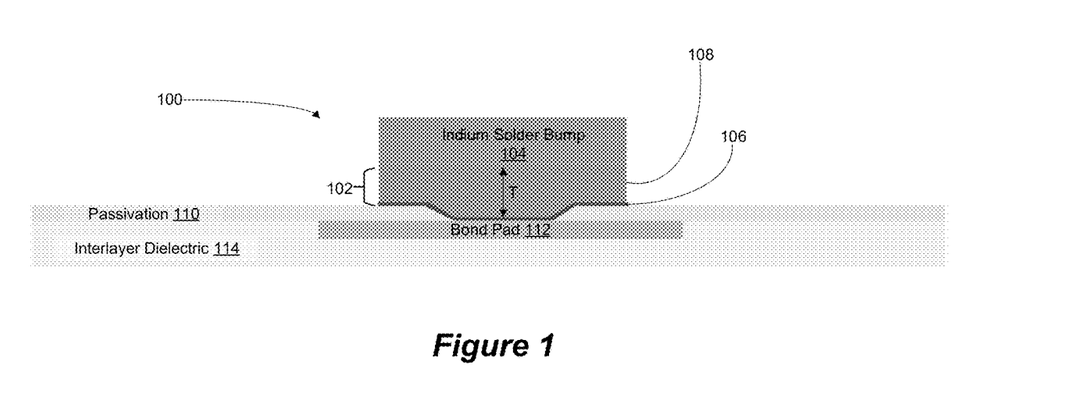
FIG. 1 is a cross-sectional view of an under bump metallization (UBM) stack with an indium solder bump formed on the UBM stack for utilization in cryogenic electronic circuits according to one embodiment of the present disclosure.

FIG. 1 is a cross-sectional view of an interconnect structure 100 including an under bump metallization (UBM) stack 102 with an indium (In) superconducting solder bump 104 formed on the UBM stack for utilization in cryogenic electronic circuits according to one embodiment of the present disclosure. The UBM stack 102 includes an adhesion and barrier layer 106 and a thick conductive stud or pillar 108 formed on the adhesion and barrier layer, with the superconducting solder bump 104 formed on the thick conductive pillar. The thick conductive pillar 108 has a vertical thickness T as shown in FIG. 1 that is sufficient to prevent the material of the thick conductive pillar from being fully consumed or converted into intermetallic regions (not shown in FIG. 1) through interdiffusion of the materials of the thick conductive pillar and the superconducting solder bump 104 that may occur at room temperature, as will be described in more detail below. Once the interconnect structure 100 is at deep cryogenic temperatures, such as when a cryogenic electronic chip (not shown) including the interconnect structure is operating in a cryogenic electronic system, the rate of the interdiffusion between the thick conductive pillar 108 and the superconducting solder bump 104 slows significantly and the formation of intermetallic regions due to such interdiffusion is no longer of concern.

In the embodiment of FIG. 1, the UBM stack 102 extends through a passivation layer 110 of a die or chip (not shown) on which the interconnect structure 100 is formed. More specifically, the adhesion and barrier layer 106 extends through an aperture in the passivation layer 110 to contact a bond pad 112 of the die or chip on which the interconnect structure 100 is formed. The bond pad 112 is electrically coupled to components (not shown) in the associated die or chip and is typically formed from a suitable metal, such as aluminum (Al), copper (Cu) or gold (Au). In the example embodiment of FIG. 1, an interlayer dielectric layer 114 surrounds the bond pad 112, with the passivation layer 110 formed on the interlayer dielectric layer and on portions of the bond pad. In the UBM stack 102, the adhesion and barrier layer 106 functions to adhere the UBM stack to the bond pad 112 and to provide a diffusion barrier between the materials of the bond pad and the thick conductive pillar 108 and superconducting solder bump 104.

The thick conductive pillar 108 of the UBM stack 102 functions as a solder wetting layer to thereby bond the UBM stack through the superconducting solder bump 104 to a circuit board or other structure (not shown) on which the superconducting solder bump is placed during a soldering or wetting process, as will be understood by those skilled in the art. During the solder wetting or reflow process, the material of the superconducting solder bump 104 becomes molten to form a connection with the thick conductive pillar 108 of the UBM stack 102 and to form a connection to the circuit board or other structure on which the superconducting solder bump is placed. In this way the superconducting solder bump 104 forms a solder joint between the UBM stack 102 and the circuit board or other structure on which the superconducting solder bump is placed. The superconducting solder bump 104 may reflowed and bonded at 175° C. after a hydrochloric acid (HCl) dip and flux application, or a reducing plasma treatment to remove residual indium oxides on the solder bump. The term "bump" as used in this description to refer to the superconducting solder bump 104 refers to a piece or volume of material that is to be used as solder to interconnect components of a cryogenic electronic circuit, with the material being a superconducting material, such as indium (In), at cryogenic temperatures.

Figure 2:
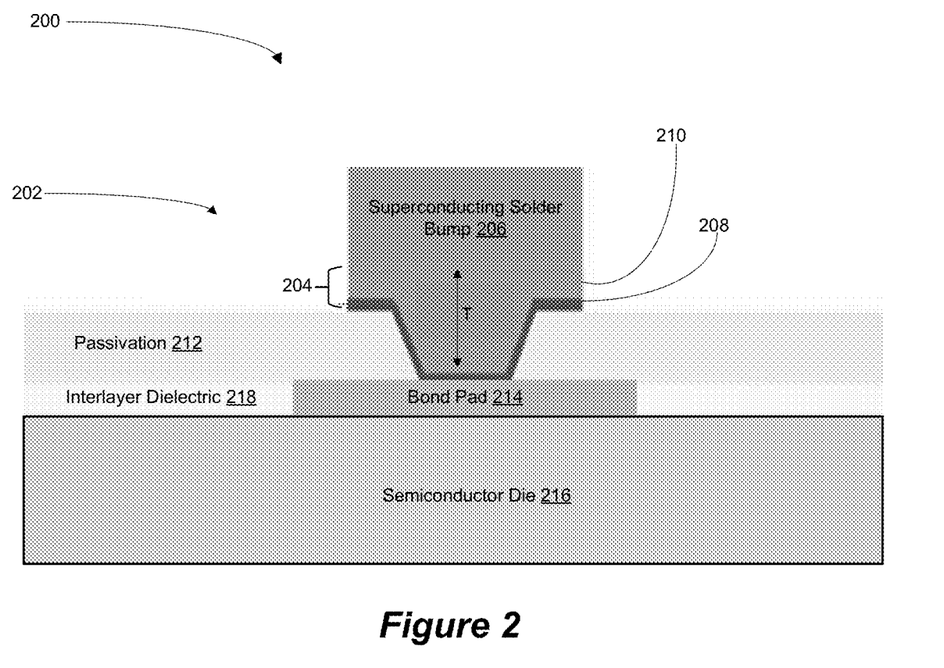
FIG. 2 is a cross-sectional view of an electronic chip including an interconnect structure including the UBM stack with an indium solder bump of FIG. 1 according to an embodiment.

In one embodiment of the interconnect structure 100, the interconnect structure is a flip chip interconnection structure in which the superconducting solder bump 104 is indium (In), the thick conductive pillar 108 is copper (Cu), and the adhesion and barrier layer 106 is a layered structure including a layer of titanium tungsten or tungsten titanium (TiW) and a thin seed layer of copper (Cu). For example, in one embodiment the layered adhesion and barrier layer 106 includes a TiW layer having a thickness of 100-150 nm and a thin Cu seed layer having a thickness of 100-200 nm. In embodiments of the interconnect structure 100, the vertical thickness T of the thick Cu pillar 108 is at least 5 µm. The adhesion and barrier layer 106 may alternatively be formed from only a layer of titanium (Ti) in some embodiments. Also note that in FIG. 1, and FIGS. 2-4 described below, that the thicknesses of the various layers are not to scale to simplify the figures. In FIGS. 1-3, for example, the thickness T of the conductive pillar 108 (e.g., 5 µm) is much larger than illustrated relative to the thickness of the passivation layer 110 (e.g., few hundred nm).

As mentioned above, copper Cu has higher rate of diffusion and formation of intermetallic regions with indium (In) at room temperature compared to other metals, such as nickel Ni. Nickel, however, is a magnetic material and accordingly may not be utilized in UBM stacks for cryogenic systems containing sensitive superconducting logic devices or any cryogenic components that are sensitive magnetic fields, such as quantum computing components. The higher rate of interdiffusion between the Cu pillar 108 and the In solder bump 104 at room temperature, and the resulting formation of intermetallic regions within the pillar, can result in the loss of adhesion between the TiW and Cu adhesion and barrier layer 106 and the Cu pillar if these intermetallic regions extend the entire vertical thickness T of the pillar. Intermetallic regions forming at the bottom of the thick conductive pillar 108 adjoining the adhesion and barrier layer 106 can cause the loss of adhesion between the pillar and the adhesion and barrier layer, resulting in failure of the interconnect structure 100. The interconnect structure 100 prevents such failures by ensuring the thickness T of the Cu pillar 108 is sufficient to ensure the intermetallic regions that form in the Cu pillar at room temperature do not extend through the entire vertical thickness T of the pillar. At room temperature, the intermetallic regions naturally form first in the top of the conductive pillar 108 adjoining the solder bump 104 due to the interdiffusion of the copper (Cu) of the pillar and the indium (In) of the solder bump. As long as these intermetallic regions extend only partially through the thickness T of the pillar 108 and do not reach bottom of the conductive pillar 108 adjoining the adhesion and barrier layer 106, the adhesion of the pillar to the adhesion and barrier layers is maintained to thereby maintain the structural integrity of the interconnect structure 100.

In the interconnect structure 100, the thickness T of the Cu pillar 108 has a value that is great enough to prevent these intermetallic regions from extending all the way from the In solder bump 104 to the adhesion and barrier layer 106, namely entirely through the thickness T of the Cu pillar. In this way, the interconnect structure 100 allows the utilization of copper (Cu) in the UBM stack 102 while also allowing the utilization of indium (In) to form the superconducting solder bump 102. Indium, as mentioned above, is unlike conventional room temperature solder materials like tin (Sn), being advantageously a ductile material at deep cryogenic temperatures while also being a superconductor below 3.4 K, being capable of being compression bonded at room temperature, and having a lower melting point than tin-based solders.

The conductive pillar 108 has the thickness T that is sufficient to prevent intermetallic regions or intermetallic compounds (IMCs) in the conductive pillar that form due to interdiffusion between the conductive pillar and the indium solder bump 104, which occurs during heat treatments and storage at room temperature, from extending through the thickness of the conductive pillar. The rate of growth of the intermetallic regions in the conductive pillar 108 is a function of temperature and a function of time. The rate of growth increases at greater temperatures and the extent to which the intermetallic regions extend within the conductive pillar 108 increase as a function of time. The thickness T of the conductive pillar is large enough to prevent complete growth of these intermetallic regions in the conductive pillar 108, or alternatively to prevent the complete consumption of the material of the conductive pillar through the entire conductive pillar for a specified application.

The specific application of the interconnect structure 100 determines the required thickness T of the conductive pillar 108. For example, the interconnect structure 100 may need to withstand, or maintain mechanical and electrical integrity after being subjected to, multiple heat treatments up to 200° C. (indium reflows at 200° C.) and storage at room temperature for multiple months. The thickness T must be large enough that these multiple heat treatments and storage at room temperature must not result in complete growth of intermetallic regions within the conductive pillar 108. Thickness T of the conductive pillar 108 could be reduced, for example, if the growth of IMCs at room temperature for a relatively short period time needed to be prevented. Embodiments of the interconnect structure 100 enable a relatively thick Cu conductive pillar 108, for example having a thickness of 5 µm, to be stored for long periods at room temperature, and be subjected to heat treatments by being brought up to solder melting temperatures (i.e., up to 200° C. for indium) multiple times, without any failure of the interconnect structure so that the structure reliably remains functional for cryogenic applications. In embodiments, where the heat treatments include multiple temperature excursions up to a maximum of 200° C., the UBM stack 102 of the interconnect structure 100 can withstand or maintain mechanical and electrical integrity when subjected to cryogenic shocks from room temperature to 4 K after the heat treatments and storage at room temperature.

FIG. 2 is a cross-sectional view of an electronic chip 200 including an interconnect structure 202 including a UBM stack 204 and a superconducting solder bump 206 according to an embodiment. The flip chip interconnection structure 202 would include a plurality of UBM stacks 204 and associated superconducting solder bumps 206 but only one UBM stack and solder bump is illustrated in FIG. 2 to simplify the figure and the associated description. The UBM stack 204 has the same structure as the UBM stack 102 of FIG. 1 in embodiments of the interconnect structure 202 and will accordingly not again be described in detail. The UBM stack 102 includes an adhesion and barrier layer 208 and a thick conductive pillar 210 formed on the adhesion and barrier layer, with the superconducting solder bump 206 formed on the thick conductive pillar. The adhesion and barrier layer 208 extends through an aperture in a passivation layer 212 to contact a bond pad 214 of a semiconductor die 216 on which the interconnect structure 202 is formed. The bond pad 112 is electrically coupled to components (not shown) in the semiconductor die 216. An interlayer dielectric layer 218 is formed on the semiconductor die 216 surrounding the bond pad 214 and the passivation layer 212 is formed on the interlayer dielectric layer and on portions of the bond pad.

In one embodiment, the interconnect structure 202 is a flip chip interconnect structure, the superconducting solder bump 206 is indium (In), the thick conductive pillar 210 is copper (Cu), and the adhesion and barrier layer 208 is a layered structure including a layer of tungsten titanium or titanium tungsten (TiW) and a thin seed layer of copper (Cu). In this embodiment, the thick Cu pillar 210 has a thickness T that is sufficient to prevent the Cu forming the pillar from being fully consumed or converted into intermetallic regions in a vertical direction as indicated by the thickness T. As discussed above in relation to FIG. 1, these intermetallic regions may form through interdiffusion of the copper (Cu) of the pillar 210 and the indium (In) of the solder bump 206 at room temperature.

Figure 3A:
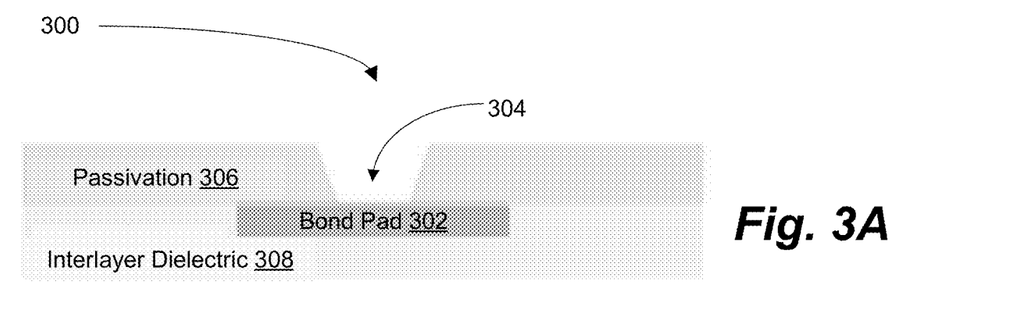
FIGS. 3A-3G illustrate a process of fabricating an interconnect structure including a UBM stack with an indium solder bump according to an embodiment of the present disclosure.
Figure 3B:
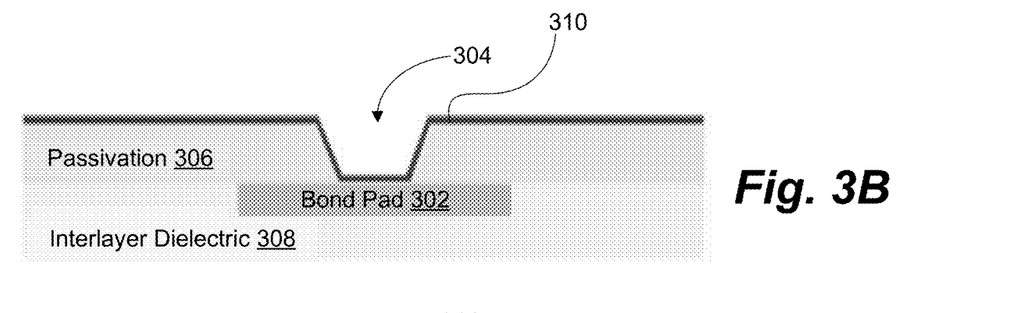
Figure 3C:
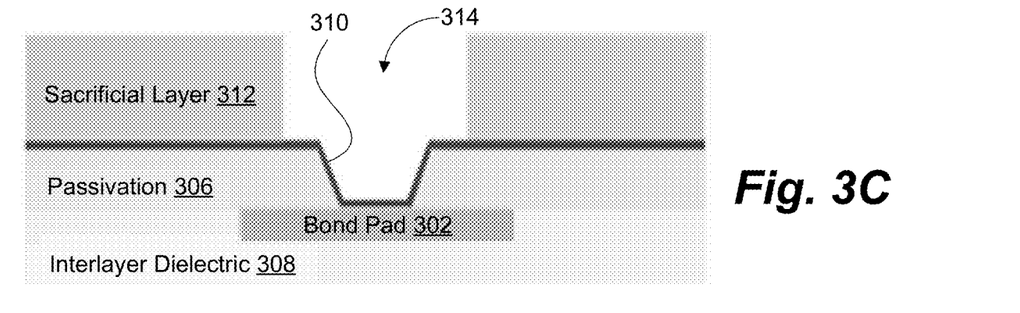

FIGS. 3A-3G illustrate a process of fabricating an interconnect structure for cryogenic electronic chips including a UBM stack with a superconducting solder bump according to an embodiment of the present disclosure. FIG. 3A shows a portion of wafer 300 to which the process is applied to form the UBM stack with a superconducting solder bump. The wafer includes bond pads 302 of a plurality of dies (not shown) in the wafer, each of the bonding pads being exposed through a corresponding aperture or opening 304 in a passivation layer 306 on a surface of wafer. Only one bond pad 302 and the corresponding opening 304 are illustrated in FIGS. 3A-3B to simplify the figures and the corresponding description of the process of forming UBM stacks and superconducting solder bumps according to this embodiment of the present disclosure. The passivation layer 306 is formed on the bond pad 302 and on an interlayer dielectric layer 308 that is formed on the surface of the die including the bond pad shown in FIG. 3A. Although not expressly shown in FIG. 3A, the bond pad 302 is electrically connected through electrical connections (not shown) in the interlayer dielectric 308 to electrical components contained in the corresponding die in the wafer, as will be appreciated by those skilled in the art.

FIG. 3B illustrates a first step of the process in which a seed layer 310 is conformally formed on the upper surface of the wafer 300. This seed layer 310 corresponds to the adhesion and barrier layer of the UBM stack and superconducting solder bump being formed. The seed layer 310 may be formed through deposition of a suitable material or materials, such as through sputtering or evaporation, on the upper surface of the passivation layer 306 and on angled edges of the passivation layer and the bond pad 302 exposed in the opening 304 of the passivation layer. In one embodiment, the seed layer 310 is a layered structure including a plurality of layers that collectively provide the adhesion and barrier functions of the UBM stack. This layered structure of the seed layer 310 may include a layer of titanium tungsten or tungsten titanium (TiW) and a thin seed layer of copper (Cu) in embodiments. In one embodiment, the layered seed layer 310 includes a TiW layer having a thickness of 100-150 nm and a thin Cu seed layer having a thickness of 100-200 nm. The seed layer 310 also functions as a plating base layer for subsequent formation of the thick conductive pillar of the UBM stack and superconducting solder bumps on these thick conductive pillars, as will be described in more detail below.

Figure 3D:
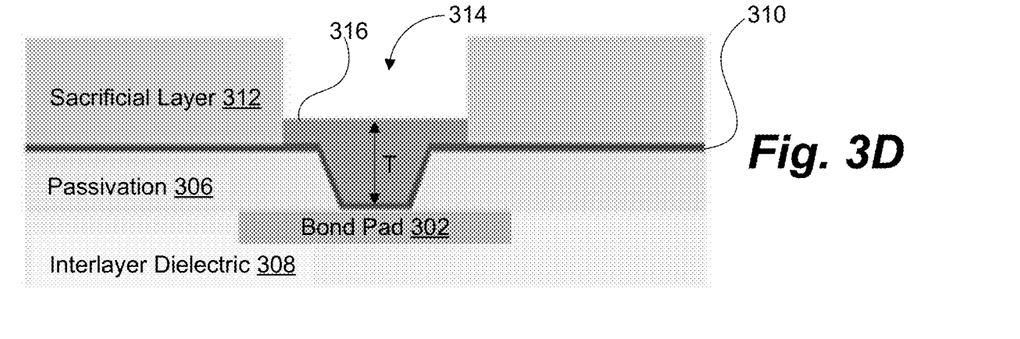

After the formation of the seed layer 310, a sacrificial layer 312 is formed on the upper surface of the structure of FIG. 3B and is patterned to form an opening 3 in the sacrificial layer 14 over the bond pad 302. The sacrificial layer 312 is a photoresist layer in one embodiment and may be formed through any suitable technique, such as through spin coating a suitable photoresist material on the structure and is similarly patterned through any suitable technique, such as etching. After the formation and patterning of the sacrificial layer 312, a thick conductive pillar 316 is formed on the exposed portion of the seed layer 310 in the opening 314 as shown in FIG. 3D. The thick conductive pillar 316 may be formed through any suitable technique, and in one embodiment is formed through electrodeposition or electroplating of a suitable material on the exposed portion of the seed layer in the opening 314. In this way, the seed layer 310 functions in this electroplating process as a seed layer and is maintained at a first voltage to attract oxidized atoms of the plating material and thereby coat the exposed portion of the seed layer in the opening 314 to form the thick conductive pillar 316. The thick conductive pillar 316 is corresponds to the solder wetting layer of the UBM stack being formed and is copper (Cu) in embodiments of the process. The thick conductive pillar 316 has a thickness T which, as described above with reference to FIGS. 1 and 2, is sufficient to prevent the Cu material of the thick conductive pillar from being fully consumed or converted into intermetallic regions along the vertical thickness of the pillar due to interdiffusion of the Cu pillar and an indium solder bump subsequently formed on the pillar. As discussed above, these intermetallic regions can result in the loss of adhesion between Cu pillar 316 and the seed layer 310 and thereby the failure of the interconnect structure 100.

Figure 3E:
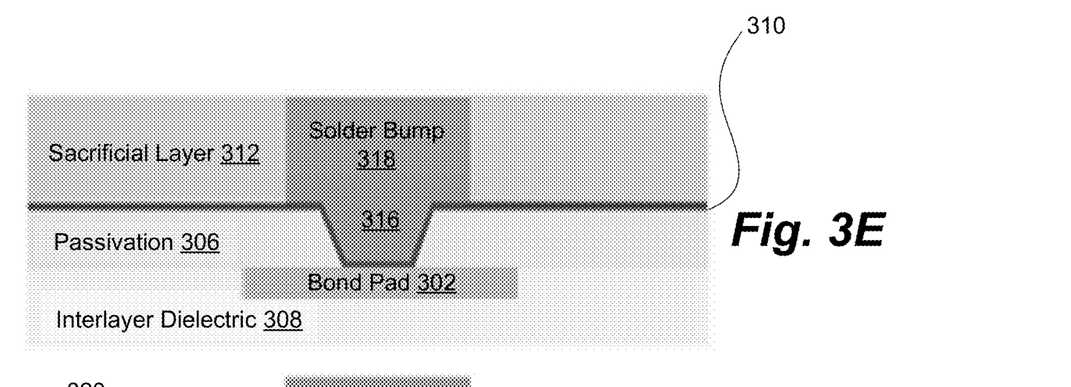

Once the thick conductive pillar 316 has been formed as shown in FIG. 3D, a superconducting solder bump 318 is formed on the thick conductive pillar 316 as seen in FIG. 3E. The thick conductive pillar 316 may be formed through any suitable technique, and in one embodiment is advantageously formed through electrodeposition or electroplating of a suitable superconducting material, such as indium (In), on the exposed portion of the thick conductive pillar 316. The seed layer 310 and thick conductive pillar 316 are maintained at a first voltage to attract oxidized atoms of the plating material, such as indium, to thereby coat the exposed portion of the seed layer in the opening 314 to form the thick conductive pillar 316. Formation of the indium solder bump 318 through electroplating has several advantages including being much faster and wasting less indium material compared to other methods of formation such as through a PVD process.

Figure 3F:
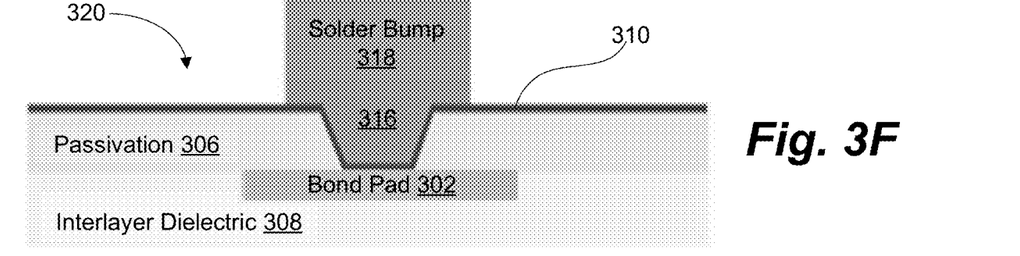
Figure 3G:
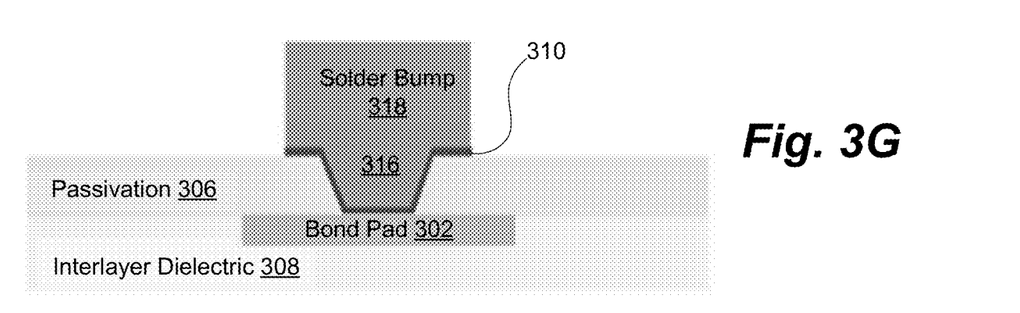

Upon formation of the superconducting solder bump 318 as shown in FIG. 3E, the process thereafter removes the sacrificial layer 312 as shown in FIG. 3F. The removal of the sacrificial layer 312 may be done through any suitable technique, such as etching, which removes the sacrificial layer without removing the thick conductive pillar 316 and solder bump 318. When the sacrificial layer 312 has been removed as seen in FIG. 3F, unwanted portions 320 of the seed layer 310 still remain on the upper surface of the passivation layer 306. These unwanted portions 320 of the seed layer 310 are to the left and right of the solder bump 318 and pillar 316 in FIG. 3F and are then removed. As seen in FIG. 3G, the unwanted portions 320 of the seed layer 310 have been removed, such as through etching, to form the desired UBM stack and superconducting solder bump 318 on the UBM stack. The etching of the remaining unwanted portions 320 of the seed layer 310 is selective relative to the superconducting solder bump 318, meaning the etching does not remove the material of the superconducting solder bump. Thus, the material or materials of seed layer 310 may be selected, at least in part, to enable this selective etching or removal of unwanted portions of the seed layer while not removing the material of the solder bump 318. The UBM stack includes the remaining portion of the seed layer 310 under the thick conductive pillar 314, with this remaining portion of the seed layer forming the adhesion and diffusion barrier layers of the UBM stack. The thick conductive pillar 316 on the remaining portion of the seed layer 310 forms the solder wetting layer of the UBM stack having the superconducting solder bump 318 formed on this pillar.

The process of FIGS. 3A-3G is compatible with readily available commercial solder bump processing equipment and materials. Moreover, the process requires only one lithography step and is easy to scale to volume batch processes. The resulting superconducting solder bumps have been shown to be reliable for cryogenic applications requiring subsequent storage and heat treatment. An additional advantage of this process is that the Cu electroplating can be increased to achieve a Cu pillar structure having an even greater thickness T than shown in the embodiments of FIGS. 1-3. A Cu pillar with a greater thickness T allows for higher standoff for a cryogenic electronic chip including an interconnect structure with UBM stacks of the present application. A higher standoff for the UBM stacks can help relieve coefficient of thermal expansion (CTE) mismatch stress or make flux cleaning and underfilling processes easier.

The process of FIGS. 3A-3G requires the seed layer 310 be formed from a material that can be removed without removing the superconducting solder bump 318 and the thick conductive pillar 316. Where the seed layer 310 includes a TiW layer and a thin Cu seed layer and the superconducting solder bump 318 is indium (In), the seed layer may be etched in the presence of the indium (In) solder bump using hydrogen peroxide ($H_2O_2$) and ammonium hydroxide (NH4OH) based etchants in embodiments of the present disclosure.

Figure 4:
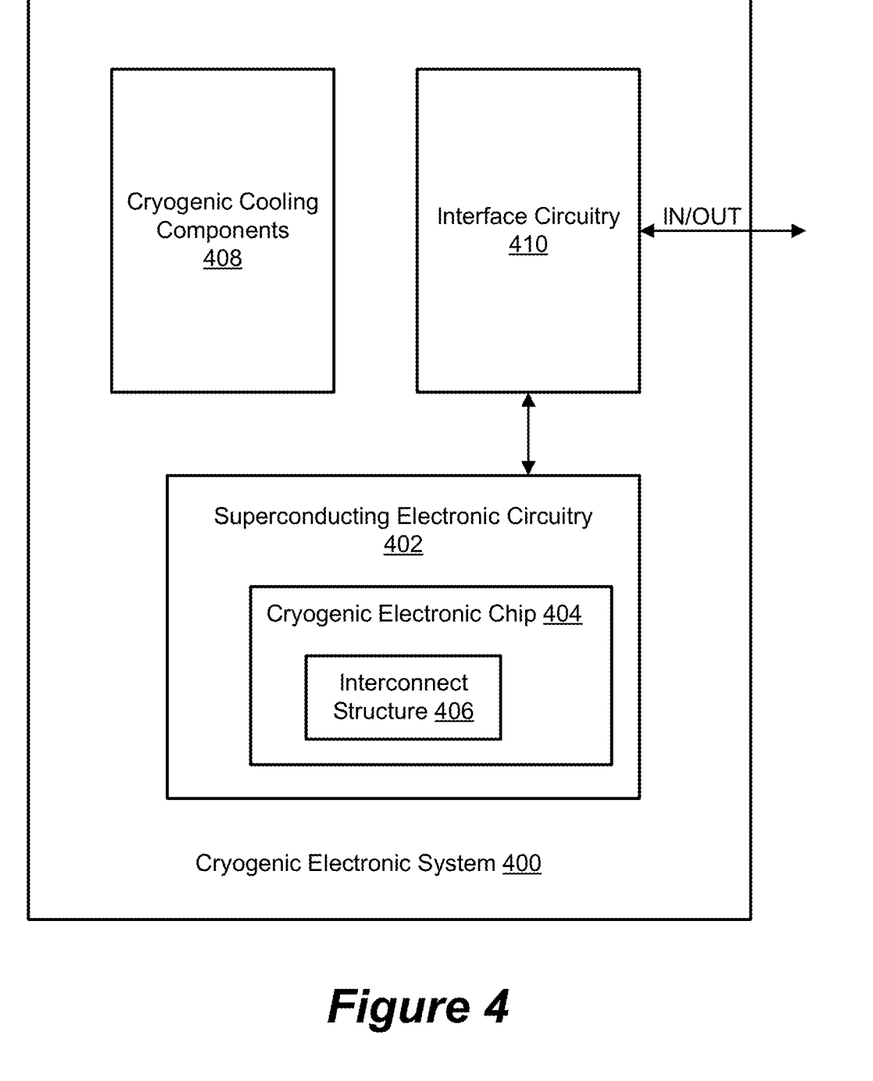
FIG. 4 is a simplified functional block diagram of a cryogenic electronic system including one or more of the cryogenic electronic chips of FIG. 2 according to an embodiment.

FIG. 4 is a simplified functional block diagram of a cryogenic electronic system 400 including superconducting electronic circuitry 402 containing one or more cryogenic electronic chips 404 having interconnect structures 406 according to an embodiment of the present disclosure. The superconducting electronic circuitry 402 includes circuitry for performing the required functions of the cryogenic electronic system 400. In one embodiment, the superconducting electronic circuitry 402 corresponds to quantum computing circuitry. The interconnect structures 406 correspond to one or more of the interconnect structures described above in relation to the embodiments of FIGS. 1-3. The cryogenic electronic system 400 includes cryogenic cooling components 408 to cool and maintain the superconducting electronic circuitry 402 at deep cryogenic temperatures during operation. Interface circuitry 410 is also coupled to the superconducting electronic circuitry 402 and functions to provide an interface to receive input data IN from external electronic circuitry (not shown) operating at room temperature and to provide this input data to the superconducting electronic circuitry. The interface circuitry 410 also receives data from the superconducting electronic circuitry 402 and provides this data as output data OUT from the cryogenic electronic system 400 to the external electronic circuitry.

FURTHER EXAMPLE EMBODIMENTS

In various embodiments, the present disclosure includes systems, methods, and apparatuses for resilient data storage. The following techniques may be embodied alone or in different combinations and may further be embodied with other techniques described herein.

In one embodiment, a cryogenic under bump metallization (UBM) stack, comprises: an adhesion and barrier layer; a conductive pillar on the adhesion and barrier layer, the conductive pillar configured to function as a solder wetting layer of the UBM stack and having a thickness; and an indium superconducting solder bump on the conductive pillar, the thickness of the conductive pillar being sufficient to prevent intermetallic regions in the conductive pillar that form due to interdiffusion between the conductive pillar and the indium superconducting solder bump during heat treatments and storage at room temperature from extending through the thickness of the conductive pillar.

In one embodiment of the cryogenic UBM stack, the adhesion and barrier layer comprises a layered structure including a plurality of layers.

In one embodiment of the cryogenic UBM stack, the layered structure has a layer of tungsten titanium (TiW) and a thin seed layer of copper (Cu).

In one embodiment of the cryogenic UBM stack, the layer of TiW has a thickness of 100-150 nm and the thin seed layer of Cu has a thickness of 100-200 nm.

In one embodiment of the cryogenic UBM stack, the conductive pillar is copper (Cu).

In one embodiment of the cryogenic UBM stack, the thickness of the Cu pillar is at least 5 µm.

In one embodiment of the cryogenic UBM stack, the adhesion and barrier layer is a titanium (Ti) layer.

In one embodiment of the cryogenic UBM stack, the adhesion and barrier layer may be selectively removed relative to the superconducting solder bump.

In another embodiment, a cryogenic electronic chip, comprises: a semiconductor die including a bond pad; and an under bump metallization (UBM) stack on semiconductor die, the UBM stack including: an adhesion and barrier layer on the bond pad; a conductive pillar on the adhesion and barrier layer, the conductive pillar being a solder wetting layer of the UBM stack and having a thickness; and an indium superconducting solder bump on the conductive pillar, the thickness of the conductive pillar having a value great enough to prevent intermetallic regions in the conductive pillar that form due to interdiffusion between the conductive pillar and the indium superconducting solder ball during heat treatments and storage at room temperature from extending through the thickness of the conductive pillar to the adhesion and barrier layer.

In another embodiment of the cryogenic electronic chip, the adhesion and barrier layer is a layer of tungsten titanium (TiW) and a thin seed layer of copper (Cu) and the conductive pillar is copper (Cu).

In another embodiment of the cryogenic electronic chip, wherein the heat treatments include multiple temperature variations up to a maximum of 200° C. and wherein the UBM stack can maintain mechanical and electrical integrity after being subjected to cryogenic shocks from room temperature to 4 K subsequent to the heat treatments and storage at room temperature.

In another embodiment, a method of forming a cryogenic under bump metallization (UBM) stack, comprises: forming a seed layer on a passivation layer of a wafer and on a bond pad of a semiconductor die in the wafer that is exposed through an opening in the passivation layer; forming a sacrificial layer on the seed layer; patterning the sacrificial layer to expose a portion of the seed layer on the bond pad; forming a thick conductive pillar on the exposed portion of the seed layer, the thick conductive pillar having a thickness great enough to prevent intermetallic regions in the thick conductive pillar from extending through the entire thickness of the conductive pillar; forming an indium superconducting solder bump on the thick conductive pillar; removing the patterned sacrificial layer to expose portions of the seed layer; and removing the exposed portions of the seed layer to form the UBM stack under the indium superconducting solder bump. The UBM stack includes an adhesion and barrier layer formed by the remaining portion of the seed layer under the thick conductive pillar and a solder wetting layer formed by the thick conductive pillar.

In one embodiment of the method, forming the seed layer comprises depositing one or more materials on the passivation layer and on the bond pad exposed through the opening in the passivation layer.

In one embodiment of the method, depositing the one or more materials comprises sputtering or evaporation of the one or more materials.

In one embodiment of the method, the one or more materials include tungsten titanium (TiW) and copper (Cu).

In one embodiment of the method, forming the sacrificial layer on the seed layer comprises depositing a photoresist layer on the seed layer.

In one embodiment of the method, forming the thick conductive pillar on the exposed portion of the seed layer comprises depositing a conductive material on the exposed portion of the seed layer through electroplating the conductive material on the exposed portion of the seed layer.

In one embodiment of the method, forming the indium superconducting solder bump on the thick conductive pillar comprises depositing indium on the thick conductive pillar through electroplating.

In one embodiment of the method, the conductive material is copper (Cu).

In one embodiment of the method, removing the exposed portions of the seed layer to form the UBM stack comprises selectively etching the exposed portions of the seed layer to remove the exposed portions without removing the indium superconducting solder bump.

The various features and processes described above may be used independently of one another or may be combined in various ways. All possible combinations and subcombinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner Blocks or states may be added to or removed from the disclosed example embodiments. The example systems and components described herein may be configured differently than described. For example, elements may be added to, removed from, or rearranged compared to the disclosed example embodiments.

Conditional language used herein, such as, among others, "can," "could," "might," "may," and the like, unless specifically stated otherwise, or otherwise understood within the context as used, is generally intended to convey that certain embodiments include, while other embodiments do not include, certain features, elements, and/or steps. Thus, such conditional language is not generally intended to imply that features, elements and/or steps are in any way required for one or more embodiments or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A cryogenic under bump metallization (UBM) stack, comprising:
   a bond pad;
   an adhesion and barrier layer formed on the bond pad;
   a conductive pillar on the adhesion and barrier layer, the conductive pillar configured to function as a solder wetting layer of the UBM stack and having a thickness; and
   an indium superconducting solder bump on the conductive pillar, the thickness of the conductive pillar being sufficient to prevent intermetallic regions in the conductive pillar that form due to interdiffusion between the conductive pillar and the indium superconducting solder bump during heat treatments and storage at room temperature from extending through the thickness of the conductive pillar.

2. The cryogenic UBM stack of claim 1, wherein the adhesion and barrier layer comprises a layered structure including a plurality of layers.

3. The cryogenic UBM stack of claim 2, wherein the layered structure has a layer of tungsten titanium (TiW) and a thin seed layer of copper (Cu).

4. The cryogenic UBM stack of claim 3, wherein the layer of TiW has a thickness of 100-150 nm and the thin seed layer of Cu has a thickness of 100-200 nm.

5. The cryogenic UBM stack of claim 1, wherein the conductive pillar is copper (Cu).

6. The cryogenic UBM stack of claim 5, wherein the thickness of the Cu pillar is at least 5 μm.

7. The cryogenic UBM stack of claim 1, wherein the adhesion and barrier layer is a titanium (Ti) layer.

8. The cryogenic UBM stack of claim 1, wherein adhesion and barrier layer may be selectively removed relative to the indium superconducting solder bump.

9. A cryogenic electronic chip, comprising:
   a semiconductor die including a bond pad; and
   an under bump metallization (UBM) stack on semiconductor die, the UBM stack including:
      an adhesion and barrier layer on the bond pad;
      a conductive pillar on the adhesion and barrier layer, the conductive pillar being a solder wetting layer of the UBM stack and having a thickness; and
      an indium superconducting solder bump on the conductive pillar, the thickness of the conductive pillar having a value great enough to prevent intermetallic regions in the conductive pillar that form due to interdiffusion between the conductive pillar and the indium superconducting solder ball during heat treatments and storage at room temperature from extending through the thickness of the conductive pillar to the adhesion and barrier layer.

10. The cryogenic electronic chip of claim 9, wherein the adhesion and barrier layer is a layer of tungsten titanium (TiW) and a thin seed layer of copper (Cu) and the conductive pillar is copper (Cu).

11. The cryogenic electronic chip of claim 10, wherein the heat treatments include multiple temperature variations up to a maximum of 200° C. and wherein the UBM stack can maintain mechanical and electrical integrity when subjected to cryogenic shocks from room temperature to 4 K subsequent to the heat treatments and storage at room temperature.

* * * * *